US006168690B1

(12) United States Patent
Jewett et al.

(10) Patent No.: US 6,168,690 B1
(45) Date of Patent: *Jan. 2, 2001

(54) METHODS AND APPARATUS FOR PHYSICAL VAPOR DEPOSITION

(75) Inventors: Russell F. Jewett, Newark; Neil M. Benjamin, East Palo Alto; Andrew J. Perry, Fremont; Vahid Vahedi, Albany, all of CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/939,182

(22) Filed: Sep. 29, 1997

(51) Int. Cl.[7] .................................................. C23C 14/34
(52) U.S. Cl. .............................. 204/192.12; 204/298.06; 204/298.08; 204/298.13
(58) Field of Search ................... 204/298.12, 298.06, 204/298.18, 298.13, 298.08, 192.12, 298.19

(56) References Cited

U.S. PATENT DOCUMENTS

| | | | |
|---|---|---|---|
| 2,069,835 | * 2/1937 | Keller | 204/298.12 |
| 3,501,393 | * 3/1970 | Wehner et al. | 204/298 |
| 3,595,773 | 7/1971 | Wurm et al. | 204/192 |
| 3,619,402 | * 11/1971 | Wurm | 204/298 |
| 3,985,635 | * 10/1976 | Adam et al. | 204/298 |
| 5,069,770 | * 12/1991 | Glocker | 204/192.12 |
| 5,135,634 | * 8/1992 | Clarke | 204/298.06 |
| 5,178,739 | 1/1993 | Barnes et al. | 204/192 |
| 5,401,350 | * 3/1995 | Patrick et al. | 156/345 |
| 5,512,155 | * 4/1996 | Fukasawa | 204/298.11 |
| 5,580,428 | * 12/1996 | Krivokapic et al. | 204/192.12 |
| 5,693,197 | * 12/1997 | Lal et al. | 204/192.2 |
| 5,707,498 | * 1/1998 | Ngan | 204/192.12 |
| 5,798,029 | * 9/1998 | Morita | 204/298.16 |
| 5,800,688 | * 9/1998 | Lantsmann et al. | 204/298.06 |

FOREIGN PATENT DOCUMENTS

| | | |
|---|---|---|
| 1905058 | 1/1969 | (DE) . |
| 0 807 954 A1 | 11/1997 | (EP) ................. 37/34 |

OTHER PUBLICATIONS

PCT International Preliminary Examination Report, EPO (Oct. 11, 1999).

S. M. Rossnagel et al., "Metal Ion deposition from ionized mangetron sputtering discharge," Jan./Feb. 1994, Journal of Vacuum Science & Technology.

Peter F. Cheng et al., "Directional deposition of Cu into semiconductor trench structures using ionized magnetron sputtering," Mar./Apr. 1995, Journal of Vacuum Science & Technology.

* cited by examiner

*Primary Examiner*—Stephen Kalafut
*Assistant Examiner*—Julian A. Mercado
(74) *Attorney, Agent, or Firm*—Beyer Weaver & Thomas, LLP

(57) ABSTRACT

The invention relates to an improved sputter target that is a combination sputter target and induction antenna. In one embodiment, when the sputter target is energized sputter material particles are sputtered away from the sputter target and a plasma is induced.

In another embodiment, the sputter target is energized by an energy source. In yet another embodiment, the energy source includes a bias power supply and an induction power supply. The bias power supply applies a potential to the sputter target relative to an object. The induction power supply applies a current to the sputter target. The potential and the current promote the sputtering away of the sputter target, the formation of the plasma and the anisotropic distribution of the sputtered material particles.

21 Claims, 8 Drawing Sheets

METHODS AND APPARATUS FOR PHYSICAL VAPOR DEPOSITION

BACKGROUND OF THE INVENTION

The present invention relates to physical vapor deposition. More particularly, the present invention relates to improved methods and apparatuses for ionized physical vapor deposition.

Generally physical vapor deposition, commonly referred to as sputtering, is a method of transferring a material from a sputtering target to an object. Sputtering is normally carried out by applying a voltage differential between the sputtering target and the object to promote the migration of the material from the sputtering target to the object.

FIG. 1 depicts a prior art physical vapor deposition (PVD) apparatus 10. Physical vapor deposition apparatus 10 includes a sputter target 15, a chuck 20 and a direct current bias power supply 25. The PVD apparatus 10 has an internal chamber 12 within which the sputter target 15 and chuck 20 are placed. An object 30 is typically placed on chuck 20. Internal chamber 12 is typically kept at a very low pressure and argon gas is introduced into internal chamber 12 at low pressure. The gas in the plasma state is suitable for sputtering material off of a target.

The D.C. bias power supply 25 negatively biases sputtering target 15 relative to ground. The electric potential created between sputtering target 15 and ground promotes the ionization of the argon gas particles. The ions are bombarded against sputter target 15, sputtering off metal particles 40. Metal particles 40 bombard the entire chamber 12 and some of the metal particles 40 are typically deposited on to object 30.

In order to promote a greater rate of sputtering an externally generated magnetic field 50 is typically induced near sputter target 15. Magnetic field 50 promotes the formation of a plasma 45 having a higher density of ions closer to sputter target 15. The presence of a greater number of ions near sputter target 15 creates a greater number of interactions between the ions and the sputter target, thus allowing a higher rate of sputtering.

One drawback of prior art PVD apparatuses has been the large amounts of power required to sputter at acceptable rates. Sometimes power supply 25 is required to generate 20 kilowatts of power in order to obtain acceptable deposition rates.

Another disadvantage of the prior art PVD apparatus 10 is that the metal particles 40 sputtered away from sputtering target 15 are isotropically distributed. That is, sputter particles 40 travel in individually random directions. For some applications of sputtering an isotropic distribution of metal particles 40 is undesirable.

FIGS. 2A–C depict the filling of a trench 31 in object 30 that is a semiconductor substrate 30'. In many applications of sputtering the trench 31 in a semiconductor substrate 30' is required to be filled with the metal sputter material. An isotropic distribution of the metal particles 40 leads to the deposition of a layer of metal 41, as depicted in FIG. 2B. The metallic layer 41 forms not only at the bottom of trench 31, but also along the walls of the trench. Eventually, as seen in FIG. 2C, trench 31 is filled by the metallic layer 41, but often times a void 43 is left within the trench. Voids 43 within the trenches often times lead to failures of the finished semiconductor device.

FIGS. 3A–B depict the filling of the trench 31 by anisotropically distributed metal particles. Anisotropically distributed metal particles travel in the same general direction. Thus, anisotropically directed metal particles 40 aimed orthogonally towards the semiconductor substrate 30' will deposit a more uniform metallic layer 41'. As seen in FIGS. 3A and 3B, metallic layer 41' fills trench 31 uniformly from the bottom up, and prevents the formation of voids 43.

Prior art methods of anisotropically depositing metal particles have several disadvantages. FIG. 4, for example, depicts a prior art PVD apparatus 10' utilizing a collimator 60. Collimator 60 screens out metal particles 40 to only allow those metal particles orthogonally directed towards object 30 to pass through. In order to ensure that metal particles 40 do not collide with other particles between the collimator 60 and object 30 (and hence become isotropically distributed), a greater vacuum is required within chamber 12.

Screening out a large portion of the sputtered metal population lowers the rate of deposition. Therefore, higher power must be used to obtain similar rates to PVD devices without collimators.

FIG. 5 depicts another prior art PVD apparatus 10" utilizing induction coils 70 shown in a cross-sectional view. Induction coils 70 are connected to a radio frequency power supply 72. The radio frequency power supply 72 provides an alternating current through induction coils 70 inducing a plasma 45' within the circumference of coils 70.

Sputter target 15 may be independently biased by power supply 25. Bias power supply 25 regulates the rate of sputtering while radio frequency power supply 72 regulates the generation of ions. Ions diffusing to the edge of the plasma fall down the potential between the plasma and the boundaries, and obtain a velocity component normal to the boundary. This process is commonly referred to as ionized physical vapor deposition.

PVD apparatus 10", however, has several limitations. First, it typically still requires a large amount of power to generate the bias potential and energize induction coils 70. Next, induction coils 70 and sputter target 15 must be made of the same type and quality of material in order to prevent contamination. Third, induction coils 70, themselves, may also be consumed in the deposition process, requiring replacement of induction coils 70 in addition to sputter target 15.

Finally, sputter target 15 is typically not uniformly consumed. Normally, a sputter target 15 utilized in a ionized PVD system is a circular disc. The disc is typically consumed quickest in an ring pattern within the outer diameter of the disc. The non-uniformity is generally caused by externally generated magnetic field's 50 irregular attraction of ions towards sputter target 15. This non-uniform consumption of the sputter target requires more frequent replacement of sputter target 15.

The need, therefore, exists for a method and an apparatus of anisotropically depositing a sputter material onto an object with a lower rate of energy consumption. Additionally, it is preferred to minimize the number of elements utilized and consumed during the deposition process. Finally, an increase in the throughput of the deposition process is desired.

SUMMARY OF THE INVENTION

The invention relates to an improved sputter target that is a combination sputter target and induction antenna. The improved sputter target reduces the amount of power necessary to successfully perform physical vapor deposition operations. Additionally, the improved sputter simplifies the design of a physical vapor deposition apparatus.

In one embodiment, the improved sputter target is comprised of a sputter material. When the sputter target is energized sputter material particles are sputtered away and a plasma is induced such that the sputter material particles are anisotropically directed.

In another embodiment, the sputter target is energized by an energy source. In another embodiment, the energy source includes a bias power supply and an induction power supply. The bias power supply applies a potential to the sputter target relative to an object or ground. The induction power supply applies a current to the sputter target. The potential and the current promote the sputtering away of the sputter material, the formation of the plasma and the anisotropic distribution of the sputtered material particles.

In alternative embodiments, the sputter target may be any suitable size, shape and composition. In another embodiment, the sputter target may be attached to a chamber surface. In yet another embodiment, the sputter target is shielded.

A physical vapor deposition apparatus including an improved sputter target is also disclosed. In one embodiment, the physical vapor deposition apparatus also includes an energy source. The energy source includes a bias power supply, an induction power supply and a matching filter. The matching filter combines the power outputs of the power supplies to provide a combined power output to the sputter target.

A method of physical vapor deposition is further disclosed. These and other features and advantages of the present invention will become apparent upon reading the following detailed description and studying the various drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments and associated drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

In one embodiment of the present invention, a combination sputter target and induction antenna, or a sputter antenna, is disclosed. By combining the functions of a sputter target and the induction antenna into a single element, many factors of a physical vapor deposition process may be dramatically improved. First, the amount of power necessary to create a bias potential on the sputter antenna and generate an induction current through the sputter antenna may be dramatically reduced. Next, since the sputter target and the induction antenna are combined in a single element, only one element is typically necessary. The sputter antenna may also be substantially uniformly consumed, thus leading to a longer life span. Additionally, the sputter antenna may be used in a higher pressure environment, helping to increase throughput.

Figure 6:
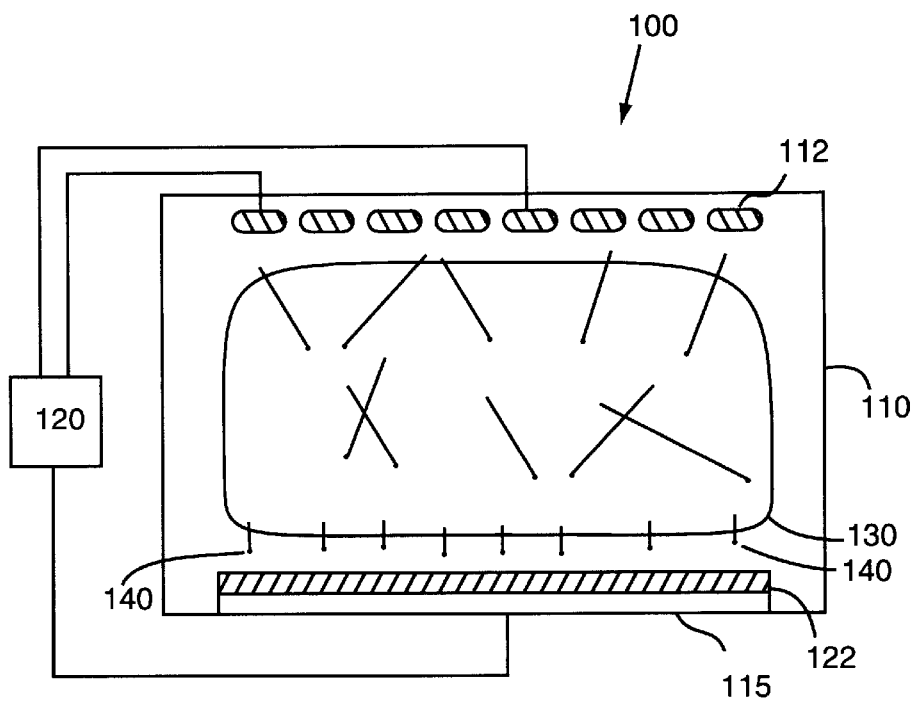
FIG. 6 depicts a schematic diagram of an improved physical vapor deposition apparatus, in accordance with one embodiment of the present invention.

The features and advantages of the present invention may be better understood with reference to the figures and discussion below. FIG. 6 depicts a schematic diagram of an improved physical vapor deposition apparatus 100, in accordance with one embodiment of the present invention. The improved physical vapor deposition apparatus 100 includes a chamber 110, a combined sputter target and induction antenna or sputter antenna 112, a chuck 115 and a power source 120. Sputter antenna 112 is mounted within chamber 110, typically opposite chuck 115. An object 122 to be deposited with the sputter material is placed on chuck 115. Power source 120 is electrically coupled to object 122 and sputter antenna 112.

A vacuum is created within chamber 110 and a gas is introduced into the chamber. The gas can be any gas suitable for use in a physical vapor deposition process. By way of example, noble gases, such as argon and xenon have been found to exhibit preferable results in the physical vapor deposition process. Additionally, other suitable gases such as nitrogen and copper gas may be utilized in the PVD process.

Power source 120 creates a bias voltage potential between object 122 and sputter antenna 112. In another embodiment, sputter antenna 112 is biased relative to ground. Additionally, power source 120 passes a radio frequency inductive current through sputter antenna 112. The inductive current passing through sputter antenna 112 creates a plasma 130. The bias voltage potential and the inductive current can be varied to vary the size and density of plasma 130. The bias potential can also be adjusted to vary the rate of sputtering.

Figure 1:
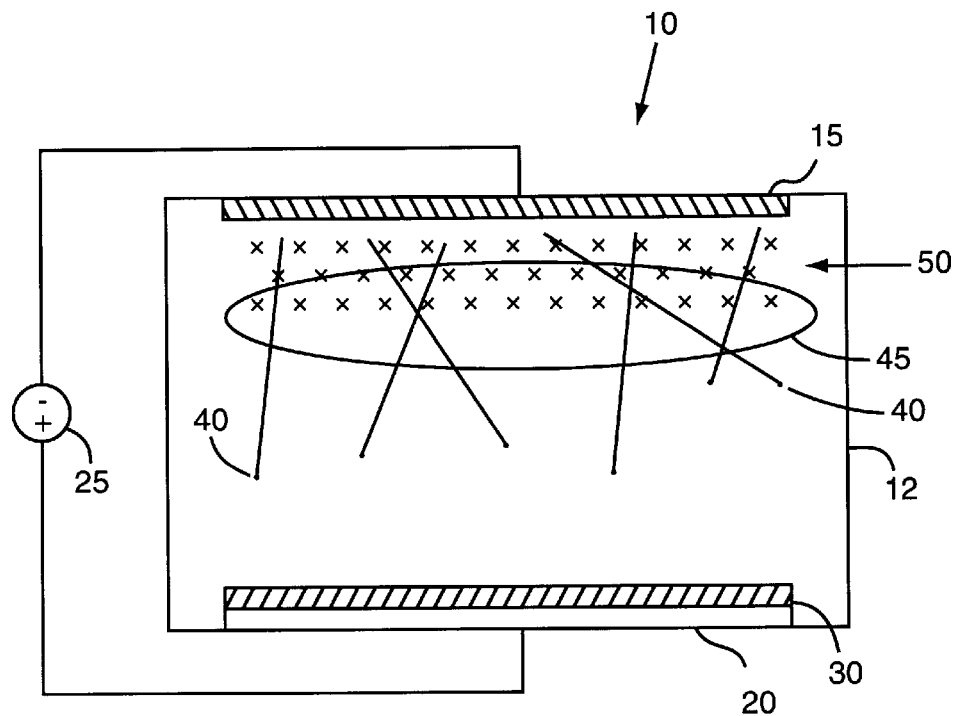
FIG. 1 depicts a prior art physical vapor deposition (PVD) apparatus.
Figures 2A, 2B, 2C:
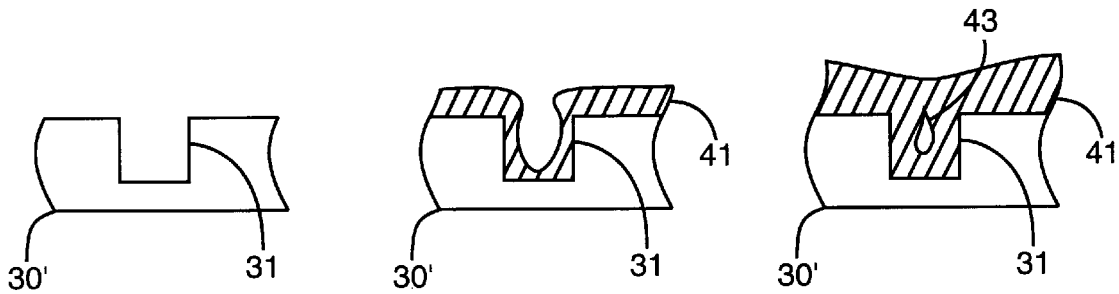
FIGS. 2A–C depict the filling of a trench in a semiconductor substrate.
Figures 3A, 3B:
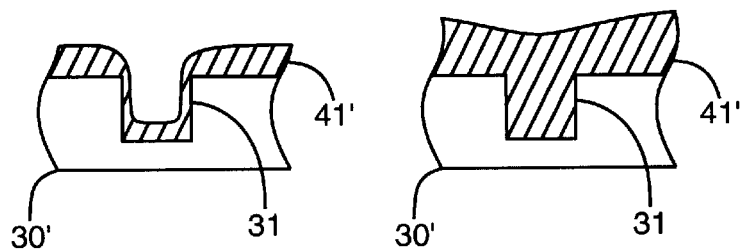
FIGS. 3A–B depict the filling of a trench by anisotropically distributed metal sputter particles.
Figure 4:
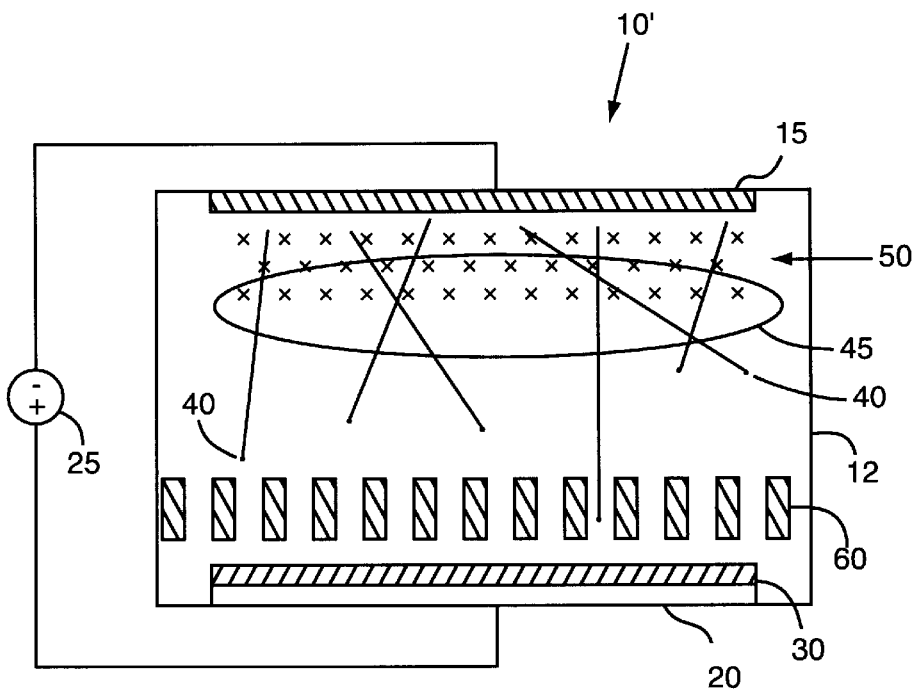
FIG. 4 is a cross-sectional view of a prior art PVD apparatus utilizing a collimator.
Figure 5:
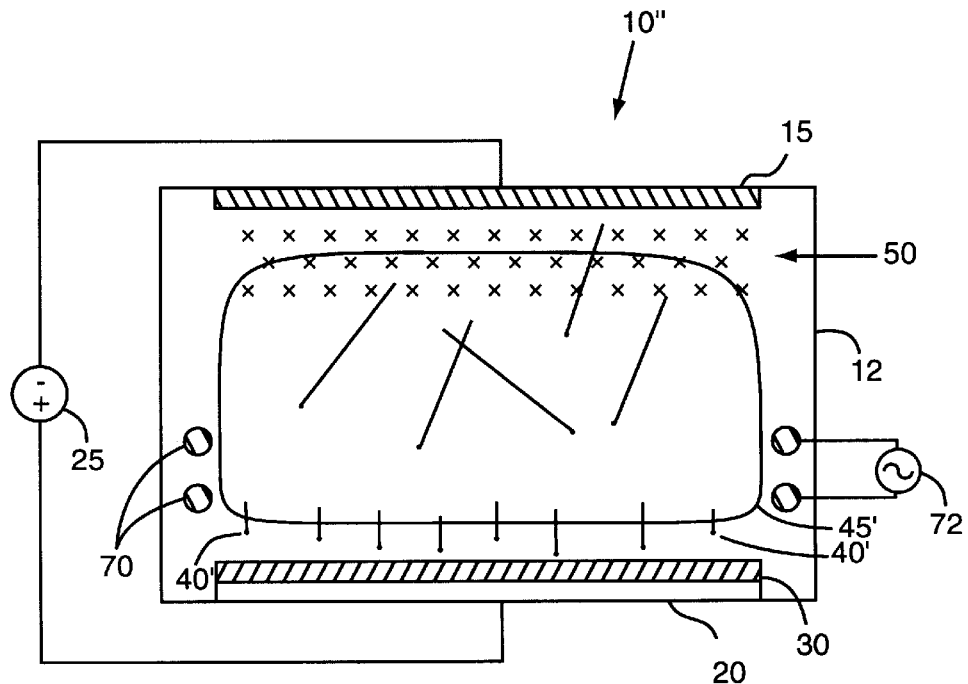
FIG. 5 is a cross-sectional view of another prior art PVD apparatus utilizing ionization induction coils shown in a cross-sectional view.

Further, no externally generated magnetic field 50 (referring back to FIGS. 1, 4 and 5) is typically required to generate plasma 130. Even without an externally generated magnetic field 50, PVD apparatus 100 is capable of generating plasmas of similar or greater charged particle densities as prior art systems utilizing an externally generated magnetic field.

However, in another embodiment, an externally generated magnetic field 50 may be applied near sputter antenna 112 to increase the residency of ions near sputter antenna 112, and further increase the efficiency of the present invention. While the use of externally generated magnetic field 50 may possibly promote non-uniform consumption of sputter antenna 112, the increase in throughput may be desirable. Regardless, the increased efficiency of either embodiment is still an improvement over prior art PVD apparatuses.

Gas ions generated by the energization of sputter antenna 112 impact upon the sputter antenna. Sputter material particles 140 may then be sputtered away from sputter antenna 112.

Figure 7:
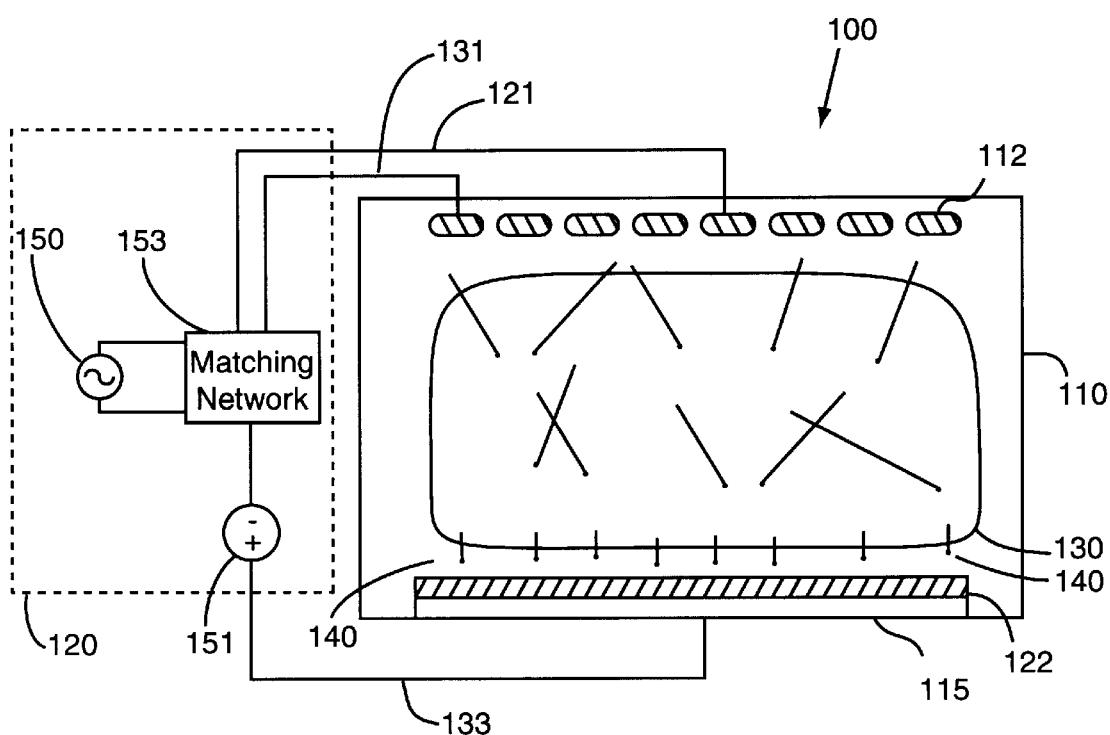
FIG. 7 is a schematic block diagram of a power source for powering the improved physical vapor deposition apparatus of FIG. 6, in accordance with one embodiment of the present invention.

FIG. 7 is a schematic block diagram of a power source 120 for powering the improved physical vapor deposition apparatus 100 of FIG. 6. Power source 120 includes induction power supply 150, bias power supply 151, and matching network 153. In one embodiment, induction power supply 150 provides a radio frequency current that is passed through sputter antenna 112. However, any type of suitable power supply that will energize sputter antenna 112 sufficiently to form a plasma may be used. The current output of induction power supply 150 can be adjusted to control plasma parameters.

In another embodiment, bias power supply 151 is a direct current voltage supply. The voltage is applied between sputter antenna 112 and object 122. The voltage level on bias power supply 151 can be adjusted to control the sputter rate. In alternative embodiments, any suitable power supply that can produce a voltage potential between sputter antenna 112 and object 122 may be used. By way of example, bias power supply 151 may be an alternating current power supply, or an alternating current power supply with a voltage offset. Again, sputter antenna 112 may also be biased relative to ground rather than object 122.

The outputs of induction power supply 150 and bias power supply 151 are coupled to matching network 153. Matching network 153 matches the outputs of the power supplies 150 and 151 to match the appropriate impedances of sputter antenna 112 for efficient power transfer to the plasma.

Matching network 153 is electrically coupled to sputter antenna 112 by conductors 121 and 131. Conductors 121 and 131 close a circuit with sputter antenna 112 and provide the induction current generated by induction power supply 150. Conductors 121 and 131 also provide the bias voltage generated by bias power supply 151 relative to object 122, which is electrically coupled to bias power supply 151 by conductor 133. In an alternative embodiment, object 122 may be separately biased with respect to ground.

Figure 8A:
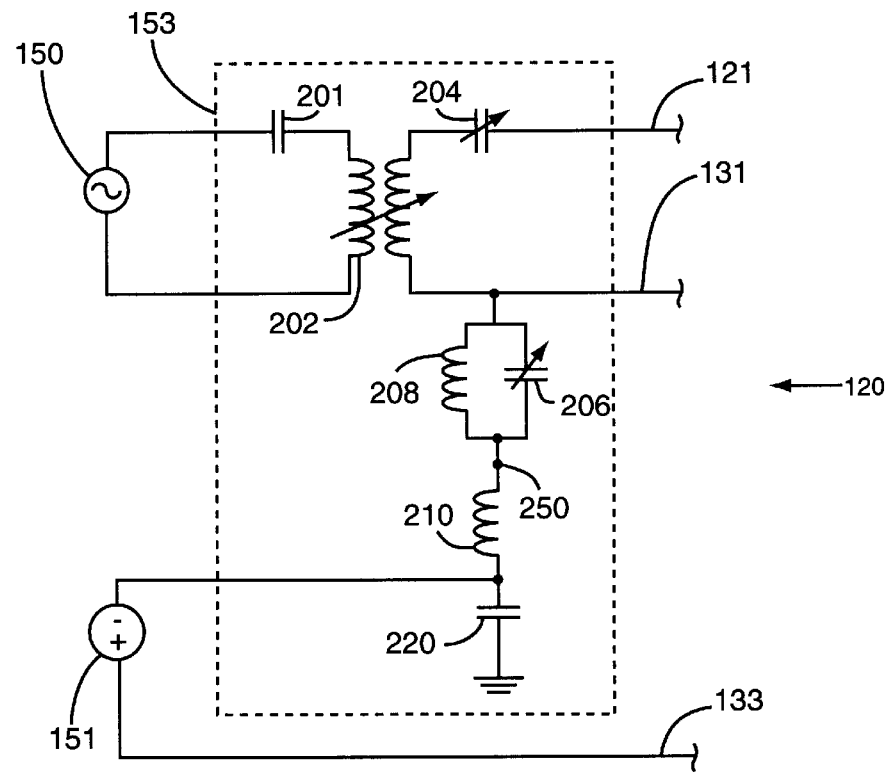
FIGS. 8A and 8B are schematic diagrams of alternative embodiments of a matching network, in accordance with alternate embodiments of the present invention.
Figure 8B:
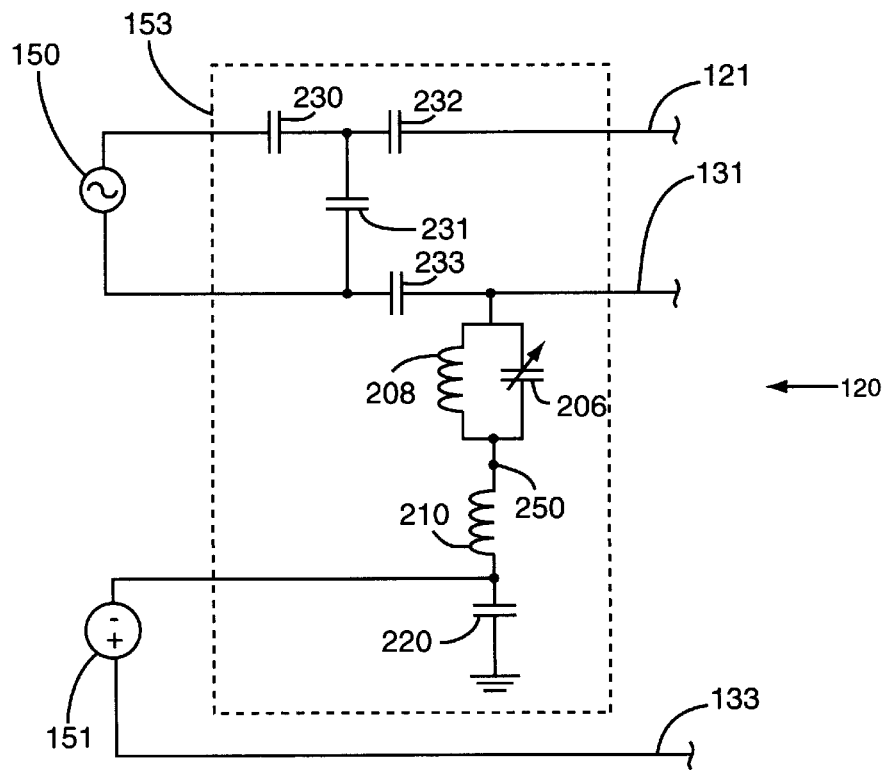

FIGS. 8A and 8B are schematic diagrams of alternative embodiments of matching network 153. In one embodiment, as depicted in FIG. 8A, matching network 153 includes capacitors 201 and 220, a variable transformer 202, variable capacitors 204 and 206 and inductors 208 and 210. Capacitor 201, variable transformer 202 and variable capacitor 204 provide a matching circuit which combines the outputs of power supplies 150 and 151. Inductor 208 and variable capacitor 206 provide impedance matching between the power supplies 150 and 151. Inductor 210 and capacitor 220 form a low pass filter for the output of bias power supply 151.

In another embodiment, as depicted in FIG. 8B, matching network 153 includes capacitors 230–233. Capacitors 230–233 form a matching circuit rather than the transformer embodiment depicted in FIG. 8A. In either embodiment of the present invention, a node 250 may be located between the low pass filter and the impedance matching circuit. An object that may be desired to be biased in addition to sputter antenna 112 may be coupled to node 250, as discussed further below.

Matching network 153 is coupled to sputter antenna 112 by conductors 121 and 131. In one embodiment, bias power supply 151 is also coupled to object 122 by conductor 133 in order to provide the necessary reference for the bias voltage. Additionally, any suitable matching circuitry may be utilized to combine the outputs of power supplies 150 and 151.

A distinct advantage of the present invention is the additive effects of the bias potential and the inductive current applied to a single element. The bias potential need not be as high as in prior art devices since the bias potential alone is not needed to create the plasma.

Unlike the prior art devices, the density of plasma 130 created by sputter antenna 112 may be significantly greater than the plasmas of prior art devices utilizing only bias power. Densities as high as $5\times10^{11}$ charged particles per cubic centimeter may be generated utilizing sputter antenna 112.

Accordingly, the bias voltage potential may be as low as about 200 volts. A bias voltage of 250 volts has been shown to provide a useful sputter rate. The alternating induction current may also be varied in magnitude and frequency to adjust the characteristics of plasma 130. By way of example, induction current power magnitudes of about 500 to about 5,000 watts at 13.56 MHz have produced desirable results. Typically, the magnitude of the induction current is more significant than the frequency. However, the present invention may be utilized at any suitable induction current frequency.

A sufficiently ionized plasma 130 generated by sputter antenna 112 ensures an anisotropic distribution of ionized particles traversing the sheath at any boundary. Thus, the improved ionized PVD apparatus 100 can be operated at higher pressures of gas. By way of example, pressures of about 0.1 to about 50 millitorr of argon have shown to produce desirable results. In one embodiment, a pressure of about 10 millitorr of argon has produced satisfactory results.

Table 1 provides the approximate values used in one embodiment shown to produce desirable results.

TABLE 1

| Pressure | 10 millitorr of argon |
|---|---|
| Gas Flow | 50 standard cm³ of argon |
| Bias Voltage | 250 volts |
| Induction Power | 750 Watts @ 13.56 Mhz |

In general, sputter antenna 112 may be any suitable shape or size capable of inducing a plasma which allows uniform deposition on object 122. By way of example, sputter antenna 112 may be shaped as a flat spiral coil, a hemispherical coil, a conical coil, a plate, a disc, a linear element, a slotted plate, or a slotted disc.

Figure 9A:
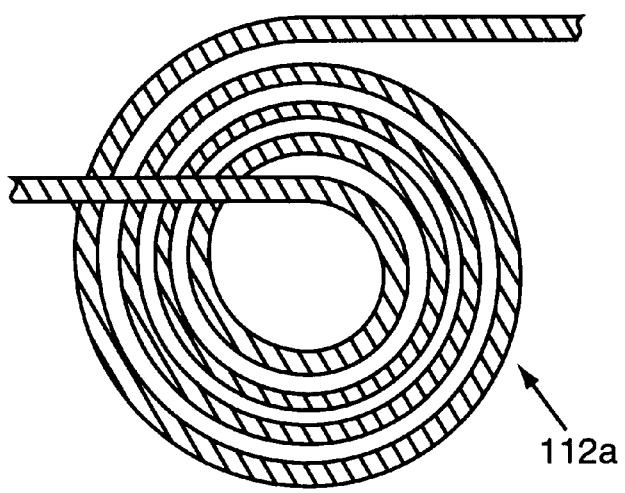
FIGS. 9A and 9B illustrate exemplary shapes of a sputter antenna, in accordance with alternate embodiments of the present invention.
Figure 9B:
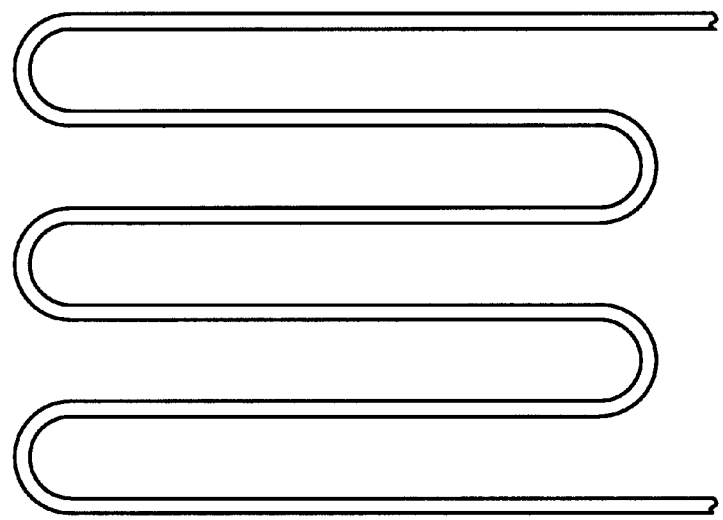

While sputter antenna 112 may be any suitable shape, in another embodiment, a linearly elongated shape may be utilized. A linearly elongated sputter antenna discourages the non-uniform energization of sputter antenna 112, causing non-uniform consumption. Thus, a linearly elongated sputter antenna promotes uniform consumption. Any linearly elongated shape may be utilized. By way of example, FIGS. 9A and 9B illustrate a linearly elongated sputter antenna shaped into a substantially flat coil 112a and a zig zag configuration 112b, respectively.

Similarly, the cross-section of the linearly elongated sputter antenna may also be any suitable shape. FIGS. 10A–10D illustrate exemplary cross-section shapes of sputter antenna 112. FIGS. 10A–10D depict flattened ovular 180a, circular 180b, semi-circular 180c cross-sections and cut-out cross-section 180d, respectively. However, the cross-section of sputter antenna 112 may be any suitable shape.

In a further embodiment, the cross-sectional shape of sputter antenna 112 may be varied to control the directional sputtering of the sputter material according to the current density distribution of the shapes when current is passed through it. By creating a greater surface area on one side of sputter antenna 112 than the other side more sputter particles may be generated on one side. By way of example, the semi-circular cross-section 180c of FIG. 10C will generate more sputter particles on the circular side of sputter antenna 112 than the flat side. In this manner the cross-sectional shape of sputter antenna 112 can aid in directing the sputter particles. Any suitable cross-sectional shape with a surface area greater on one side than the other may be utilized. By way of example, the cut-out cross-section 180d depicted in FIG. 10D may be used.

The composition of sputter antenna 112 may be any suitable sputter material. Typically, metals are used as sputter materials since metals are capable of carrying the inductive current supplied by induction power supply 150. However, any material capable of carrying a current may be used as the sputter material. By way of example, aluminum, copper, aluminum alloys, zinc, tin, tungsten, gallium, titanium, and tantalum may be used.

Figure 10A:
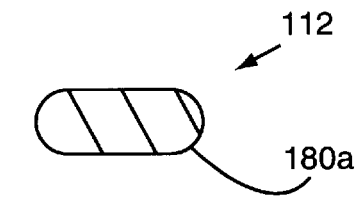
FIGS. 10A–10E illustrate exemplary cross-section shapes of a sputter antenna, in accordance with alternate embodiments of the present invention.
Figure 10B:
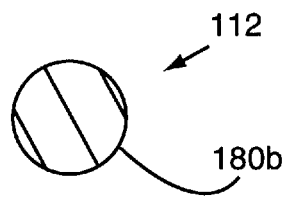
Figure 10C:
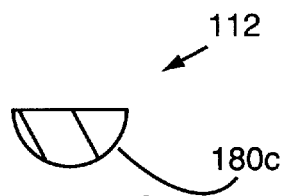
Figure 10D:
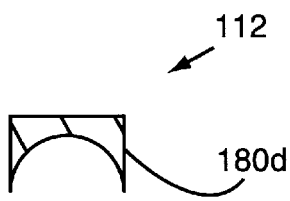
Figure 10E:
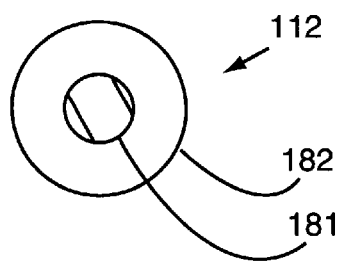

FIG. 10E illustrates a cross-section of a hybrid sputter antenna 112' in accordance with one embodiment of the present invention. The hybrid sputter antenna includes a core 181 and an outer sheath 182.

Typically, high resistivity materials are not good candidates as a sputter material in PVD devices because large amounts of power are lost via resistive losses. In one embodiment of the present invention, resistive materials may be used as the sputter material, or the outer sheath 182. The core 181 may be a conductive material and the outer sheath 182 may be a resistive material. Core 181 is appropriately energized by power source 120, but rather than core 181 being sputtered away, the resistive material of the outer sheath 182 is sputtered away and deposited on object 122.

Any resistive material suitable for sputtering may be used as the outer sheath 182. By way of example, titanium nitride, aluminum nitride, and tantalum nitride may be used. Accordingly, any two suitable materials may be used as long as the material used for core 181 is less resistive than the material used for outer sheath 182.

Figure 11:
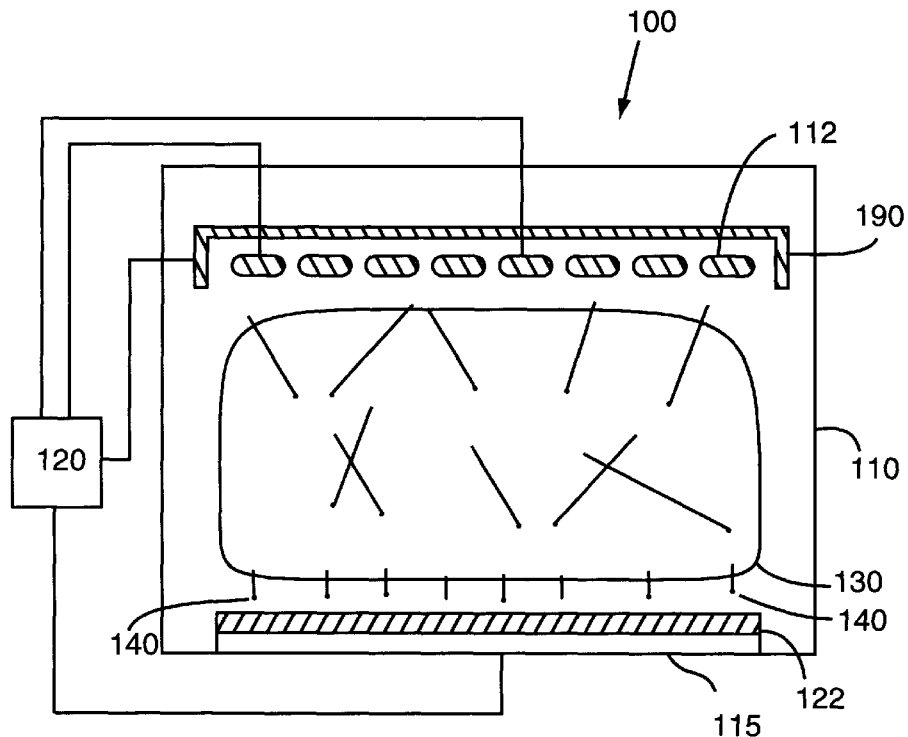
FIG. 11 is a cross-sectional view of an alternative embodiment of a sputter antenna, in accordance with the present invention.

FIG. 11 depicts an alternative embodiment of the sputter antenna of FIG. 6. In the embodiment depicted in FIG. 6, sputter antenna 112 is mounted within chamber 110 but detached from the chamber surface. One potential disadvantage is that the sputter material may sputter away from both sides of sputter antenna 112. Sputter material sputtered away from the side of sputter antenna 112 facing the chamber wall may be more likely to deposit on the chamber wall or some other part of the chamber rather than on object 122. It is desirable that the side of sputter antenna 112 facing object 122 be sputtered away while the other side is not.

In the alternative embodiment, a shield 190 may be placed between sputter antenna 112 and the wall of the chamber facing the sputter antenna. Shield 190 may be coupled to power source 120 and may be biased by the power source with the same bias potential as sputter antenna 112. Since shield 190 and sputter antenna 112 are similarly biased, the portions of sputter antenna 112 facing shield 190 may be less likely to be sputtered away compared to the portions of sputter antenna 112 facing object 122. Shield 190 may, for example, be coupled to node 250 of the illustrated embodiments of power source 120 in FIGS. 8A and 8B.

Figure 12:
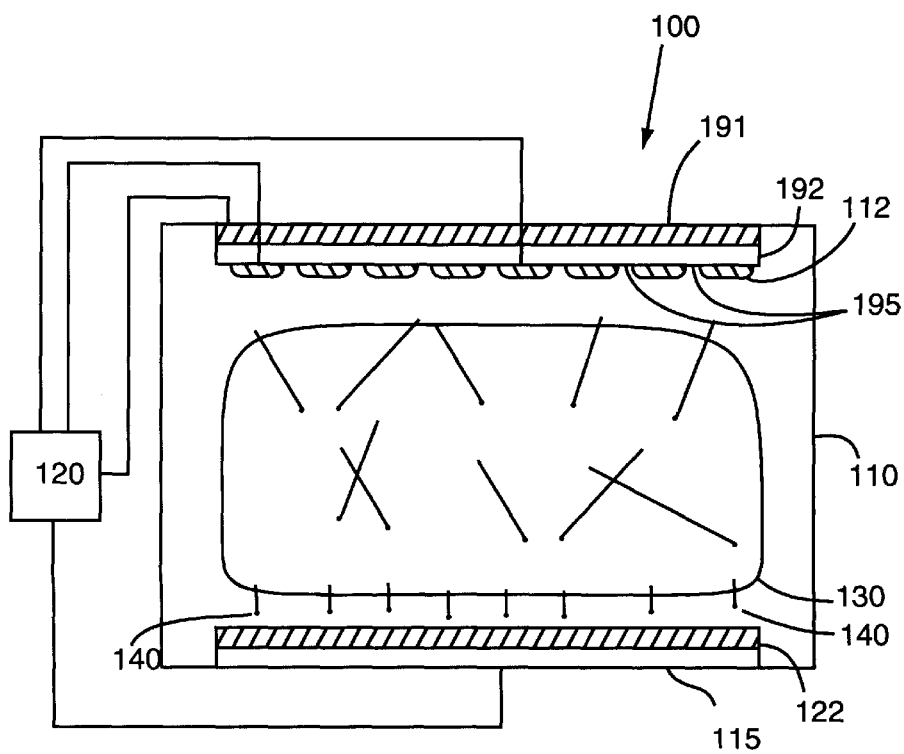
FIG. 12 is a cross-sectional view of another embodiment of a sputter antenna, in accordance with the present invention.

FIG. 12 illustrates another embodiment of the sputter antenna of FIG. 6. As another method of allowing the sputter material to be sputtered away from sputter antenna 112 asymmetrically, sputter antenna 112 may be mounted to the wall of chamber 110. An insulator 192 and a conductor 191 may be placed between sputter antenna 112 and the wall of the chamber. Insulator 192 provides insulation between conductor 191 and sputter antenna 112. Conductor 191 is coupled to power source 120 and may be biased similarly to sputter antenna 112.

Biasing of conductor 191 prevents the depositing of sputter particles 140 on exposed portions 195 of insulator 192. Insulator 192 may also be a dielectric.

Figure 13:
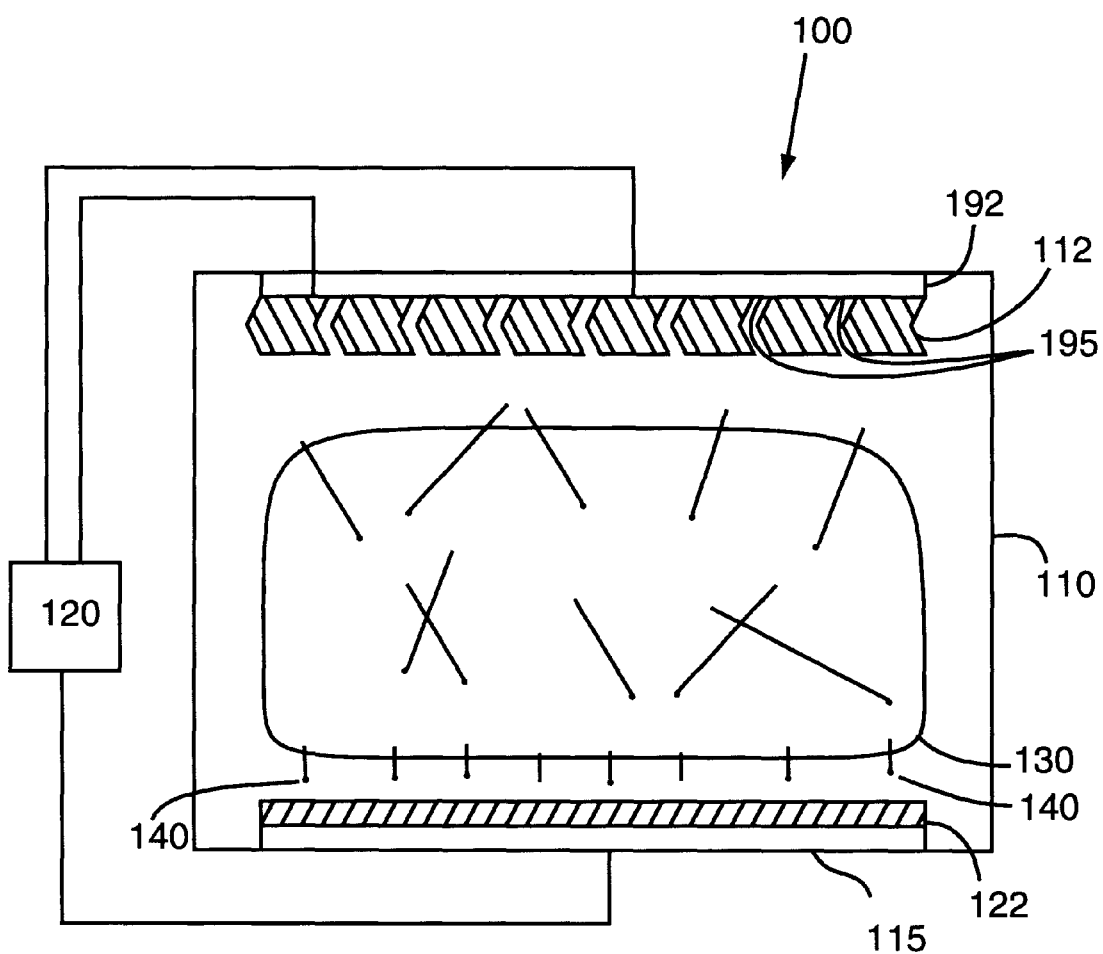
FIG. 13 is a cross-sectional view of yet another embodiment of a sputter antenna, in accordance with the present invention.

FIG. 13 illustrates yet another embodiment of the sputter antenna of FIG. 6. Sputter antenna 112 may be mounted on a wall of chamber 110, again to promote uniform consumption of sputter antenna 112 on only one side of the sputter antenna. Rather than using a powered conductor as illustrated in FIG. 112, different geometries of the cross-section of sputter antenna 112 may be employed. Insulator 192 is placed between sputter antenna 112 and the chamber wall. To avoid deposition of sputter material particles 140 on the exposed portions 195 of insulator 192 the cross-section of sputter antenna 112 is a jagged shape. The jagged shape helps to screen out any sputter particles 140 from depositing on the exposed portions 195.

While the illustrated embodiment depicts smooth angled walls surrounding exposed portions 195, sputter antenna 112 may have any suitable shape. By way of example, the walls could be a stair step configuration or the walls may contain more turns. Practically any configuration of sputter antenna 12 that will discourage ions from reaching exposed portions 195 may be suitable.

The combination of a sputter target and an induction antenna in a physical vapor deposition process is a new and non-obvious advance in the field. As discussed, prior art PVD devices have utilized collimators or separate induction coils in order to anisotropically deposit material onto an object. Up until the present invention, there has been no suggestion of combining a sputter target with an induction antenna in a PVD process to promote anisotropically distributed sputter material particles.

A combined sputter target and induction antenna provides a variety of benefits. The PVD process may be performed at lower power. The pressure of the PVD process may also be increased, decreasing the cumbersome task of creating a greater vacuum, and thereby increasing the throughput. At the same time, plasmas of greater density and size may be generated than those generated by prior art devices consuming the same amount of power.

Sputter antenna 112 being a single element, additional elements are typically not required, thus removing the need to match the materials used for different elements. Also, sputter antenna 112 is typically uniformly and substantially consumed before requiring replacement. Further, alternative embodiments in accordance with the present invention provide for methods for promoting uniform and substantially complete consumption of sputter antenna 112.

It can be appreciated that the versatility of the present invention allows it to be used in other applications than those particularly described above. In another embodiment, the present invention may be used in isotropic applications. By varying the bias power supply and the induction power supply to produce isotropically distributed sputter material particles are produced. Further, isotropic deposition may also be performed with lower power consumption than prior art PVD devices. The ability of the present invention to isotropically and anisotropically deposit materials on to an object is another advantageous feature.

As evidence of the versatility of the present invention, another embodiment may be used in chemical vapor deposition. A combination of gases may be introduced into chamber 110. Sputter antenna 112 may be composed of a material that is capable of reacting with the gas mixture. Reactions between sputter material particles 140 and the introduced gas or gases occur either inside or outside plasma 130.

By way of example, argon and nitrogen may be introduced into chamber 112. Sputter antenna 112 may be composed of tantalum. Again argon promotes sputtering and does not react with the sputtered tantalum particles, while the nitrogen reacts with the tantalum. Tantalum nitride particles are formed, which are then deposited on object 122. Any suitable combinations of gases and sputter materials may be utilized to allow the deposition of a desired material. Again, any suitable combination of gases and sputter material may be utilized in accordance with the present invention.

While the present invention has been described in terms of several preferred embodiments, there are alterations, permutations, and equivalents which fall within the scope of this invention. By way of example, the present invention can be used for doping objects rather than deposition. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A sputter target for use in depositing a layer of material on an object in a plasma physical vapor deposition apparatus, said plasma vapor deposition apparatus comprising a layer of insulator, an energy source, and a gas source, said sputter target being configured to be sputtered away to produce sputter material particles for said depositing, said sputter target being further configured as a sputter antenna on the layer of insulator, the sputter antenna having a linearly elongated shape, wherein a portion of the insulator is exposed between adjacent portions of the sputter antenna, and wherein a first end of the linearly elongated shape is electrically connected to the energy source; and a second end of the linearly elongated shape is electrically connected to the energy source so that the linearly elongated shape and the energy source form a closed circuit, and wherein the energy source and the elongated shape are formed to inductively excite a gas from the gas source into a plasma, and wherein the sputter antenna is electrically connected to the object through the energy source.

2. A sputter target as recited in claim 1, wherein said energy source is a variable energy source, which controls a rate at which the sputter material particles are sputtered from the sputter target according to a setting of said variable energy source.

3. A sputter target as recited in claim 1, wherein the sputter material particles are directed towards said object in a substantially anisotropic manner when the sputter target is energized in said plasma physical vapor deposition apparatus.

4. A sputter target as recited in claim 1, wherein a shape of the sputter target is a coil.

5. A sputter target as recited in claim 4, wherein said coil is substantially planar.

6. A sputter target as recited in claim 1, wherein said energy source provides a bias between said sputter target and said object.

7. A sputter target as recited in claim 1, wherein the sputter target is comprised of a metal.

8. A sputter target as recited in claim 1, wherein the sputter target is comprised of a sputter material selected from the group consisting of aluminum, copper, aluminum alloys, tungsten, titanium and tantalum.

9. A sputter target as recited in claim 1, wherein the sputter material comprises a conductive core, said conductive core being sheathed within a outer covering, said outer covering configured to sputter away the sputter material particles when the sputter target is energized.

10. A sputter target as in claim 9 wherein said outer covering is formed of an outer covering material having a higher resistivity than said conductive core.

11. A sputter target as recited in claim 9, wherein the outer covering material is selected from the group consisting of titanium nitride, aluminum nitride and tantalum nitride.

12. A plasma-enhanced physical vapor deposition apparatus for use in depositing a layer of material on an object, comprising:
    a chamber configured to surround the object during said depositing;
    an energy source, wherein an object is placed within the chamber and is electrically coupled to the energy source; and
    a sputter target disposed within the chamber and electrically coupled to the energy source, the sputter target being configured to be sputtered away to produce sputter material particles during said depositing, the sputter target being further configured as a sputter antenna on a layer of insulator, the sputter antenna having a linearly elongated shape with a portion of the insulator being exposed between adjacent portions of the sputter antenna.

13. A plasma-enhanced physical vapor deposition apparatus as recited in claim 12, the energy source including a bias power supply, wherein said bias power supply is configured to apply bias potential to the sputter target relative to the object when the energy source energizes the sputter target, wherein the potential promotes the sputtering away of the sputter material particles from the sputter target and the sputter material particles are directed toward the object.

14. A plasma-enhanced physical vapor deposition apparatus as recited in claim 13, wherein the bias power supply is configured to apply an alternating current voltage potential and a direct current voltage potential to the sputter target, relative to the object.

15. A plasma-enhanced physical vapor deposition apparatus as recited in claim 13, wherein the bias power supply is variable, such that a rate at which the sputter material particles are sputtered away from the sputter target varies, responsive to a setting of the variable bias power supply.

16. A plasma-enhanced physical vapor deposition apparatus as recited in claim 13, further comprising:
a conductor adjacent to the insulator and coupled to the energy source, wherein the bias power supply is configured to apply the bias potential to the sputter antenna and the conductor, whereby the sputter material particles are discouraged from depositing on the exposed portion of the insulator.

17. A plasma-enhanced physical vapor deposition apparatus as recited in claim 13, wherein the walls of the adjacent portions of the sputter antenna have a shape that discourages the sputter material particles from depositing on the exposed portion of the insulator.

18. A plasma-enhanced physical vapor deposition apparatus as recited in claim 12, the energy source including an induction power supply, wherein the induction power supply is configured to apply an RF current to the sputter target when the energy source energizes the sputter target, wherein said RF current promotes the striking of the plasma within the chamber when said RF current is applied to the sputter target, whereby the sputter material particles are directed towards the object in a substantially anisotropic manner.

19. A plasma-enhanced physical vapor deposition apparatus as recited in claim 18, wherein the induction power supply is variable, such that a size and a density of the plasma varies, responsive to a setting of the induction power supply, whereby the movement of the sputter material particles towards the object is controlled.

20. A plasma-enhanced physical vapor deposition apparatus as recited in claim 12, wherein the energy source includes,
an induction power supply producing an induction power output;
a bias power supply producing a bias power output; and
a matching circuit electrically coupled to the induction power supply and the bias power supply, wherein the matching circuit combines the induction power output with the bias power output and provides a matched output to the sputter target.

21. In a plasma processing chamber, a method for depositing a layer of material on a semiconductor substrate, comprising:
positioning said semiconductor substrate in said plasma processing chamber; and
energizing a sputter target within the plasma processing chamber, the sputter target being configured to be sputtered away to produce sputter material particles for said depositing, the sputter target being further configured as a sputter antenna on a layer of insulator, the sputter antenna having a linearly elongated shape with a portion of the insulator being exposed between adjacent portions of the sputter antenna; wherein the energizing comprises:
generating a bias potential between the sputter target and the semiconductor substrate;
generating an induction current; and
combining the bias potential with the induction current producing a combined power output, wherein the combined power output is applied to the sputter target, so that the bias potential is applied during the generating of the induction current.

* * * * *